United States Patent
Li et al.

(10) Patent No.: US 11,322,548 B2
(45) Date of Patent: May 3, 2022

(54) TOP EMITTING OLED DEVICE FOR IMPROVING VIEWING ANGLE CHARACTERISTICS

(71) Applicants: KUNSHAN NEW FLAT PANEL DISPLAY TECHNOLOGY CENTER CO., LTD., Kunshan (CN); BEIJING VISIONOX TECHNOLOGY CO., LTD., Beijing (CN)

(72) Inventors: Weiwei Li, Kunshan (CN); Song Liu, Beijing (CN); Lin He, Kunshan (CN)

(73) Assignees: KUNSHAN NEW FLAT PANEL DISPLAY TECHNOLOGY CENTER CO., LTD., Kunshan (CN); BEIJING VISIONOX TECHNOLOGY CO., LTD., Beijing (CN)

( * ) Notice: Subject to any disclaimer, the term of this patent is extended or adjusted under 35 U.S.C. 154(b) by 19 days.

(21) Appl. No.: 16/698,990

(22) Filed: Nov. 28, 2019

(65) Prior Publication Data

US 2020/0098834 A1 Mar. 26, 2020

Related U.S. Application Data

(62) Division of application No. 15/109,291, filed as application No. PCT/CN2014/095968 on Dec. 31, 2014, now abandoned.

(30) Foreign Application Priority Data

Dec. 31, 2013 (CN) .......................... 201310747785.4
Dec. 31, 2013 (CN) .......................... 201310752797.6

(51) Int. Cl.
*H01L 27/32* (2006.01)
*H01L 51/50* (2006.01)
*H01L 51/52* (2006.01)
*H01L 51/00* (2006.01)

(52) U.S. Cl.
CPC .......... *H01L 27/3211* (2013.01); *H01L 51/50* (2013.01); *H01L 51/5004* (2013.01);
(Continued)

(58) Field of Classification Search
CPC ............ H01L 51/5262–5265; H01L 51/50–56
See application file for complete search history.

(56) References Cited

U.S. PATENT DOCUMENTS

| | | | |
|---|---|---|---|
| 2002/0048688 A1* | 4/2002 | Fukuoka | H01L 51/5024 428/690 |
| 2004/0195962 A1 | 10/2004 | Nakamura et al. | |
| 2005/0064237 A1* | 3/2005 | Kato | H01L 51/5012 428/690 |

(Continued)

FOREIGN PATENT DOCUMENTS

JP          2004296423 A      10/2004

OTHER PUBLICATIONS

Chen, et al. "Effect of 2,9-dimethyl-4,7-diphenyl-1,10-phenanthroline outcoupling layer on electroluminescent performances in top-emitting organic light-emitting devices." Journal of Applied Physics 103.5 (2008): 054506.*
Decision of Grant of Korean Application No. 10-2016-7020724.
Notification of First Office Action of European Application No. 14876962.3.

*Primary Examiner* — William E McClain
(74) *Attorney, Agent, or Firm* — Kilpatrick Townsend & Stockton LLP

(57) ABSTRACT

A top emitting OLED device for improving viewing angle characteristics, comprising a substrate, a first electrode, a hole injection layer, a hole transport layer, a light-emitting layer, an electron transport layer, a second electrode and a light output coupling layer sequentially stacked on the substrate, wherein the second electrode has a light transmittance no less than 25%, and the hole injection layer has a refractive index no less than 1.8.

9 Claims, 5 Drawing Sheets

(52) U.S. Cl.
CPC ...... *H01L 51/5088* (2013.01); *H01L 51/5218* (2013.01); *H01L 51/5221* (2013.01); *H01L 51/5265* (2013.01); *H01L 51/006* (2013.01); *H01L 51/0052* (2013.01); *H01L 51/0054* (2013.01); *H01L 51/0058* (2013.01); *H01L 51/0059* (2013.01); *H01L 51/0072* (2013.01); *H01L 51/0085* (2013.01); *H01L 51/5064* (2013.01); *H01L 51/5234* (2013.01); *H01L 51/5262* (2013.01); *H01L 2251/301* (2013.01); *H01L 2251/308* (2013.01); *H01L 2251/5315* (2013.01); *H01L 2251/552* (2013.01); *H01L 2251/558* (2013.01)

(56) References Cited

U.S. PATENT DOCUMENTS

| | | | |
|---|---|---|---|
| 2005/0064240 A1* | 3/2005 | Mishima | H01L 51/0058 428/690 |
| 2007/0286944 A1* | 12/2007 | Yokoyama | H01L 51/5265 427/66 |
| 2008/0224963 A1* | 9/2008 | Takagi | H01L 27/3246 345/76 |
| 2009/0104721 A1* | 4/2009 | Hirakata | C23C 14/042 438/29 |
| 2013/0001532 A1* | 1/2013 | Hwang | H01L 51/5265 257/40 |
| 2013/0038640 A1* | 2/2013 | Kajimoto | H01L 51/5265 345/690 |
| 2013/0234129 A1* | 9/2013 | Yamada | H01L 51/5088 257/40 |

\* cited by examiner

TOP EMITTING OLED DEVICE FOR IMPROVING VIEWING ANGLE CHARACTERISTICS

CROSS REFERENCE

The present application is a divisional application of the PCT international application No. PCT/CN2014/095968 filed on Dec. 31, 2014 and designating the United States with a U.S. application Ser. No. 15/109,291 and a U.S. filing date of Jun. 30, 2016, the entirety of which is incorporated herein by reference.

TECHNICAL FIELD

The present application relates to the field of organic electro-luminescent device, in particular relates to an organic light-emitting display device with blue-light pixels, green-light pixels and red-light pixels, especially refers to a top emitting OLED device for improving viewing angle characteristics.

BACKGROUND

An OLED (Organic Light-Emitting Diode) display device achieves colored display by means of light-emitting units having three colors of red, green and blue. According to different directions of the emergent light, OLED can be classified into bottom emitting devices (the emergent light exits from the substrate side) and top emitting devices (the emergent light exits from a side opposite to the substrate side). In order to obtain higher efficiency and luminance, the top emitting structure is usually adopted in an AMOLED (Active Matrix Organic Light-Emitting Diode) device. The top emitting device comprises an anode with a reflective layer and a cathode which is semi-transparent semi-reflective, so that an optical micro-cavity is formed, the light emitted by the organic material undergoes interference within the optical micro-cavity so as to obtain higher efficiency and purer chrominance. However, because of different spectrums thereof, the red, green and blue lights require different optical path lengths when undergoing interference, and therefore requiring different thicknesses of the organic layer.

Currently, in the industry, an organic layer thickness that meets the optical path requirement is usually achieved by adjusting the thickness of the HIL (Hole Injection Layer), but the added HIL thickness causes increase of the drive voltage of the device and also negatively affects the equilibrium of current carriers, which negatively affects device performance such as efficiency and service life. On the other hand, the HIL needs to match its following HTL (Hole Transport Layer), which limits the choices of the HTL material to a small range. Chinese patent literature CN101308863 discloses a material with high hole mobility being used as an auxiliary layer for adjusting resonance periods of green light and red light, however, the material with high hole mobility used by this technical solution is very limited in choices, which limits the development of its product.

The OLED (Organic Light-Emitting Diode) device, as a new active-type light-emitting display device, has light weight, thin thickness and strong shock resistance, and meanwhile uses organic semiconductor to emit light, so that it has a wide range of material choices, can achieve full-color display in the visible light range, and can easily achieve white-light illumination. Compared with the presently mainstream LCD (Liquid Crystal Display) device, the OLED device has wider viewing angle, faster response speed, no need of backlight illumination, higher light-emitting efficiency, and can achieve flexible display, thus is a type of display device that has the most promising potential to replace LCD.

According to the light exit position, OLED devices can be classified into two categories of BEOLED (Bottom Emitting OLED) devices and TEOLED (Top Emitting OLED) devices. Wherein, a BEOLED device configures its OLED on a glass substrate coated with a transparent ITO (Indium Tin Oxides) or IZO (Indium Zinc Oxides) electrode, so that, when a voltage is applied to the OLED, the light emitted by the OLED exits from the bottom thereof through the transparent ITO (or IZO) electrode and the glass substrate. In the BEOLED structure, the transparent ITO (or IZO) electrode is connected with a TFT (Thin Film Transistor) that drives the OLED, and thus there is a problem of conflict between the OLED light-emitting area and the TFT, which leads to a low Aperture Ratio of the device. On the other hand, a TEOLED applies an opaque total-reflection electrode onto a glass or silicon substrate and then applies the OLED thereon, so that, when a voltage is applied to the OLED, the light exits from a transparent or semi-transparent cathode at the top. In a display device based on TEOLED units, the TFT that drives the OLED is applied beneath the OLED, so that the light exit surface is separated from the TFT, which fundamentally solves the problem of low Aperture Ratio.

The Top Emitting OLED device comprises a total-reflection electrode and a semi-transparent electrode, such a structure forms a micro-cavity effect which generates strong multi-beam interference that has selecting, narrowing and enhancing functions on the light source, this micro-cavity effect is often used to increase chrominance of the device, to enhance emission intensity of specific wavelength and to change light-emitting color of the device. However, the existence of the micro-cavity effect adversely affects the viewing angle characteristics of the device, i.e. the light-emitting peak shifts as the viewing angle deviates, which leads to problems such as luminance differences and chrominance shifting of the display device.

Currently, the ordinary technical solution for improving the viewing angle characteristics of a Top Emitting OLED device is achieved by adding a light output coupling layer, e.g. a layer of organic substance with a high refractive index and a low absorption index such as 2,9-dimethyl-4,7-diphenyl-1,10-phenanthroline (Bathocuproine, abbreviated as BCP), upon the cathode, or vapor-coating a layer of dielectric such as ZnSe, ZnS with a high refractive index upon the surface of the semi-transparent cathode as a coupling layer for increasing the transmittance rate and the light output rate, thereby reducing the influence of multi-beam interference. However, along with the suppression of multi-beam interference, another type of interference which is wide-angle interference in the micro-cavity effect comes into functioning, and the aforementioned technical solution cannot solve the problem related to wide-angle interference. Therefore, the aforementioned technical solution has limited inhibition effect towards the micro-cavity effect in an OLED device, and thus is unable to effectively improve the viewing angle characteristics.

SUMMARY OF THE INVENTION

An objective of the present application is to solve the technical problem that deviation of luminance and chrominance occurs in a top emitting OLED device when the viewing angle deviates, and therefore to provide a top emitting OLED device for improving viewing angle characteristics.

In order to attain the above-mentioned objective, the present application adopts the following technical solution:

The present application provides a top emitting OLED device for improving viewing angle characteristics, comprising a substrate, and a first electrode, a hole injection layer, a hole transport layer, a light-emitting layer, an electron transport layer, a second electrode, a light output coupling layer sequentially stacked on the substrate, wherein the second electrode has a light transmittance no less than 25%, and the hole injection layer has a refractive index no less than 1.8.

In the above-mentioned top emitting OLED device for improving viewing angle characteristics, the hole injection layer in a blue pixel area has a refractive index of N≥2.0, the hole injection layer in a green pixel area has a refractive index of N≥1.9, the hole injection layer in a red pixel area has a refractive index of N≥1.8.

In the above-mentioned top emitting OLED device for improving viewing angle characteristics, the second electrode is made of indium tin oxide, indium zinc oxide or metal silver.

In the above-mentioned top emitting OLED device for improving viewing angle characteristics, the second electrode comprises a first metal layer and a second metal layer, wherein the first metal layer is alkali metal or alloy thereof, alkali earth metal or alloy thereof, and the second metal layer is metal silver.

In the above-mentioned top emitting OLED device for improving viewing angle characteristics, the second electrode has a thickness of 10 nm-30 nm.

In the above-mentioned top emitting OLED device for improving viewing angle characteristics, under the condition of the aforementioned refractive index ranges in the respective blue, green and red pixel areas, the hole injection layer is selected from

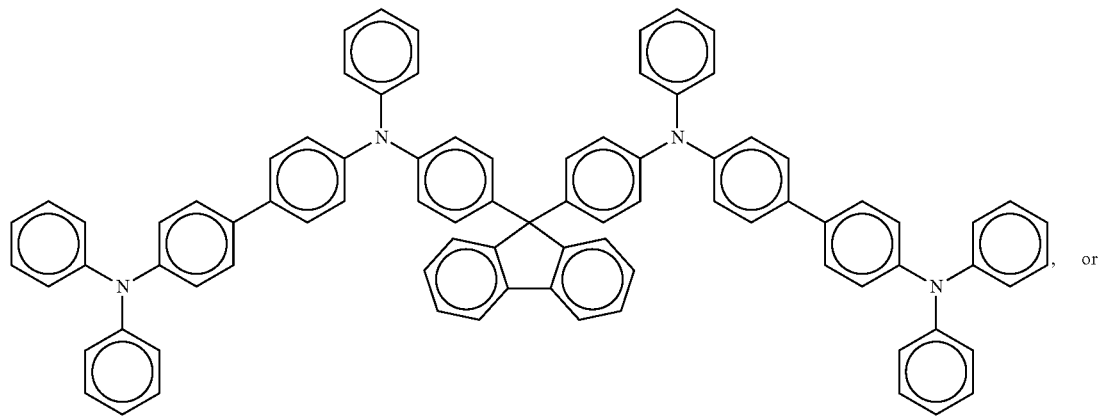

(1)

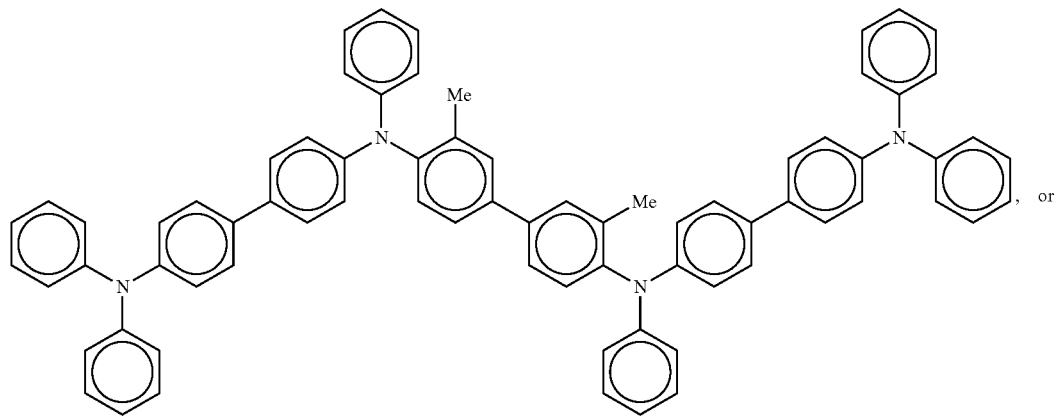

(2)

-continued (3)

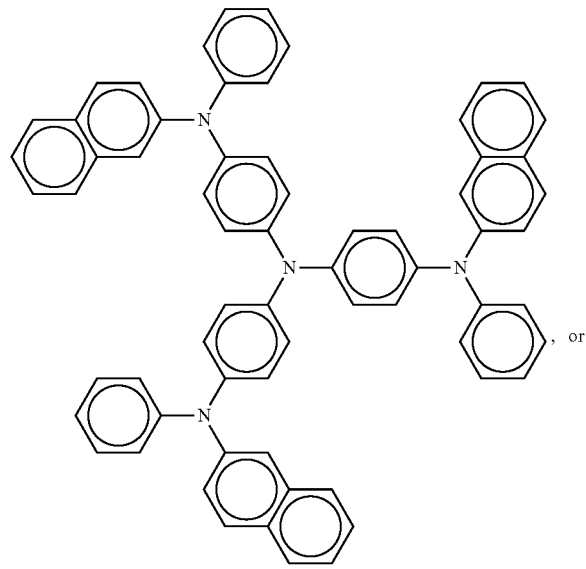
, or (4)

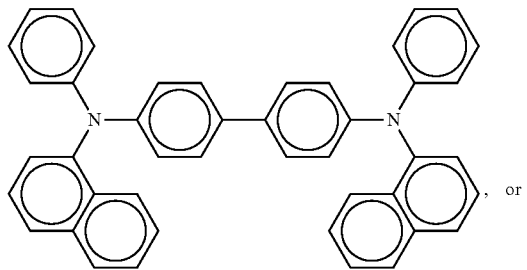
, or (5)

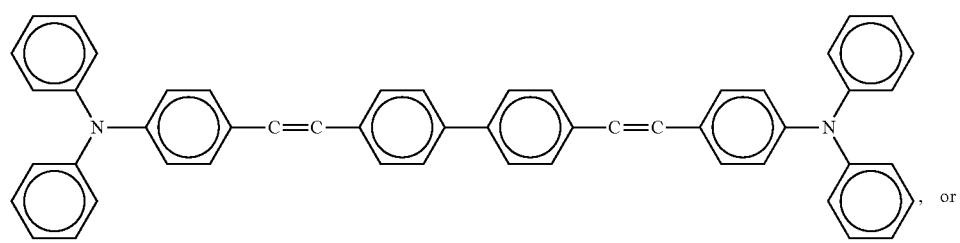
, or (6)

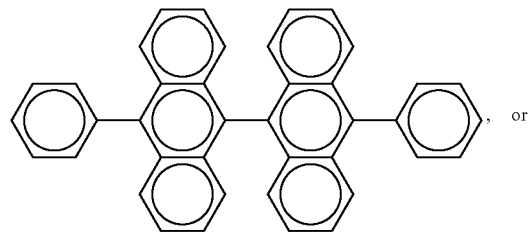
, or (7)

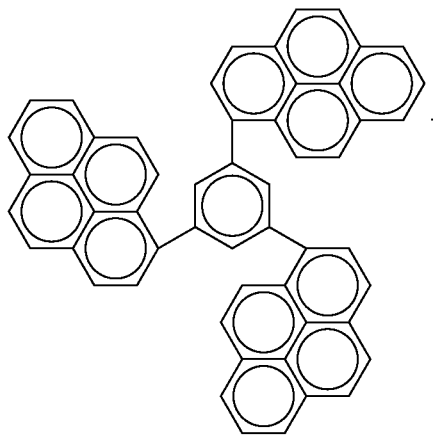
.

In the above-mentioned top emitting OLED device for improving viewing angle characteristics, the light output coupling layer is made of 2,9-dimethyl-4,7-diphenyl-1,10-phenanthroline.

The above-mentioned top emitting OLED device for improving viewing angle characteristics is characterized in further comprising an optical compensation layer disposed between the hole injection layer and the hole transport layer in the green pixel area as well as in the red pixel area, wherein the optical compensation layer has a structure with at least two tiers.

The above-mentioned top emitting OLED device for improving viewing angle characteristics is characterized in that, the optical compensation layer in the green pixel area comprises a first optical compensation tier and a second optical compensation tier, wherein a difference value of the highest occupied molecular orbital energy level of the first optical compensation tier minus the lowest unoccupied molecular orbital energy level of the second optical compensation tier is ≥−0.2 eV; the optical compensation layer in the red pixel area comprises a first optical compensation tier and a second optical compensation tier, wherein a difference value of the highest occupied molecular orbital energy level of the first optical compensation tier minus the lowest unoccupied molecular orbital energy level of the second optical compensation tier is ≥−0.2 eV.

The above-mentioned top emitting OLED device for improving viewing angle characteristics is characterized in that, the optical compensation layer in the green pixel area comprises a first optical compensation tier and a second optical compensation tier, wherein a difference value of the highest occupied molecular orbital energy level of the first optical compensation tier minus the lowest unoccupied molecular orbital energy level of the second optical compensation tier is ≥−0.2 eV; the optical compensation layer in the red pixel area comprises a first optical compensation tier, a second optical compensation tier, a third optical compensation tier and a fourth optical compensation tier, wherein a difference value of the highest occupied molecular orbital energy level of the first optical compensation tier minus the lowest unoccupied molecular orbital energy level of the second optical compensation tier is ≥−0.2 eV, the third optical compensation tier is made of a material identical to that of the first optical compensation tier, and the fourth optical compensation tier is made of a material identical to that of the second optical compensation tier.

The above-mentioned top emitting OLED device for improving viewing angle characteristics is characterized in that, the first optical compensation tier in the green pixel area and in the red pixel area is made of a material having a general formula of

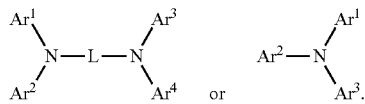

The above-mentioned top emitting OLED device for improving viewing angle characteristics is characterized in that, the second optical compensation tier in the green pixel area and in the red pixel area is made of a material having a general formula of

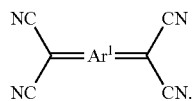

The above-mentioned top emitting OLED device for improving viewing angle characteristics is characterized in that, the second optical compensation tier in the green pixel area and in the red pixel area is made of HAT(CN) with a molecular structure of

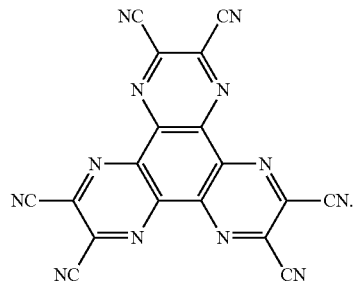 [SMILES: N#Cc1nc2c3nc(C#N)c(C#N)nc3c3nc(C#N)c(C#N)nc3c2nc1C#N]

In the above-mentioned top emitting OLED device for improving viewing angle characteristics, the second optical compensation tier in the green pixel area and in the red pixel area has a thickness of 5 nm-15 nm.

In the above-mentioned top emitting OLED device for improving viewing angle characteristics, the hole injection layer has a two-tier structure which comprises a first hole injection tier disposed on the first electrode and a second hole injection tier disposed on the first hole injection tier, wherein the first hole injection tier is made of a material identical to that of the first optical compensation tier, and the second hole injection tier is made of a material identical to that of the second optical compensation tier.

In the above-mentioned top emitting OLED device for improving viewing angle characteristics, a third hole injection tier is disposed between the first hole injection tier and the first electrode, wherein the third hole injection tier is made of a material identical to that of the second hole injection tier.

In the above-mentioned top emitting OLED device for improving viewing angle characteristics, the first optical compensation tier is made of a material with a doped structure formed by doping

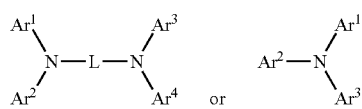

with

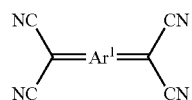

at a ratio of 100:1 to 5:1;
or, the first optical compensation tier is made of a material with a doped structure formed by doping

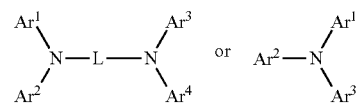

with

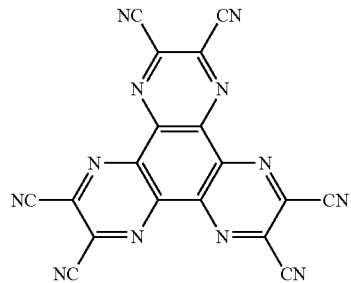 [SMILES: N#Cc1nc2c3nc(C#N)c(C#N)nc3c3nc(C#N)c(C#N)nc3c2nc1C#N]

at a ratio of 100:1 to 5:1.

Compared to prior art, the aforementioned technical solution of the present application has the following advantages:

(1) The top emitting OLED device for improving viewing angle characteristics of the present application first adopts a second electrode having a light transmittance no less than 25%, so as to inhibit multi-beam interference in the microcavity effect and improve viewing angle characteristics; but, after the multi-beam interference is suppressed, wide-angle interference in the micro-cavity effect comes into function, and therefore, in order to inhibit the wide-angle interference, the present application then adopts organic material with a high refractive index to make the hole injection layer, wherein the hole injection layer in a blue pixel area has a refractive index of N≥2.0, the hole injection layer in a green pixel area has a refractive index of N≥1.9, the hole injection layer in a red pixel area has a refractive index of N≥1.8. The hole injection layer with such a high refractive index, in cooperation with an ultra-thin structure of the second electrode, breaks the interference enhancement condition between the reflected light from the first electrode and the emitted light from the light-emitting layer, so as to weaken the wide-angle interference in the OLED device, thereby specific embodiments of the present application and with reference to the appended drawings, wherein:

FIG. 1 is a structural schematic diagram of the top emitting OLED device for improving viewing angle characteristics as described in Embodiments 1-7 of the present application;

FIG. 2 shows a variation curve of the refractive index of the tertiary amine compound selected in the present application changing along with the change of wavelength, as well as a variation curve of the refractive index of 4,4',4"-tri-(phenyl-(m-methylphenyl)-amino)-triphenylamine changing along with the change of wavelength, wherein the structural formula of the tertiary amine compound is

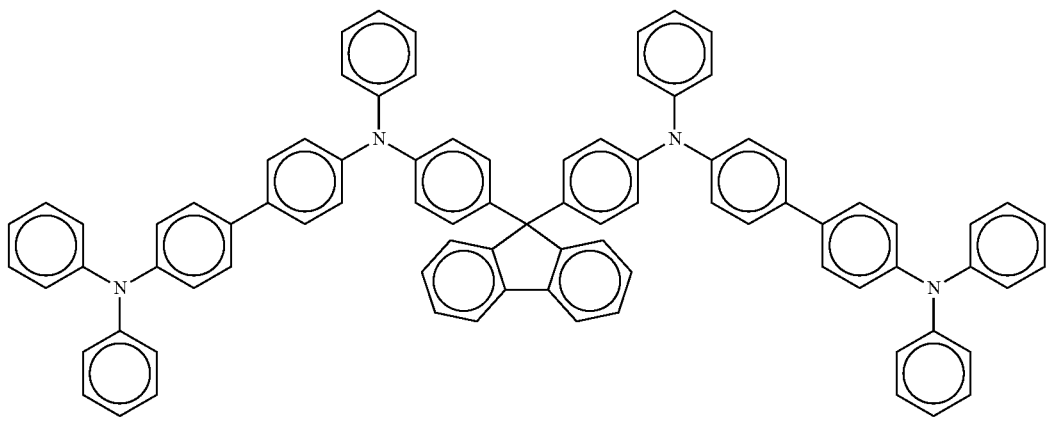

inhibiting the micro-cavity effect and thus improving viewing angle characteristics of the OLED device. Meanwhile, because the refractive index of the hole injection layer is increased, the thickness of the hole injection layer is reduced, and thus the total thickness of the entire device is reduced, so that material and working hours can be saved in the manufacture process of the devices.

(2) The top emitting OLED device for improving viewing angle characteristics of the present application is also assisted by a light output coupling layer made of material with a low light absorption index such as 2,9-dimethyl-4,7-diphenyl-1,10-phenanthroline or made of material with a high refractive index such as ZnSe and ZnS, so as to reduce light reflection of the semi-transparent metal electrode and to increase output rate of the internal emitted light, thereby further improving viewing angle characteristics of the device.

(3) In the top emitting OLED device for improving viewing angle characteristics of the present application, the optical compensation layers of the red pixel unit and of the green pixel unit have different thicknesses, and thus meet the optical path requirements of their respective spectrum resonance periods. Meanwhile, by using the configuration of organic light-emitting device of the present application, various photo-electric performances of the device are effectively improved, and a broad range of material choices is attained.

BRIEF DESCRIPTION OF THE DRAWINGS

In order to make the subject matter of the present application easy and clear to understand, hereinafter, the present application will be further described in detail according to FIG. 3 is a structural schematic diagram of the organic light-emitting device of the present application.

Figure 1:
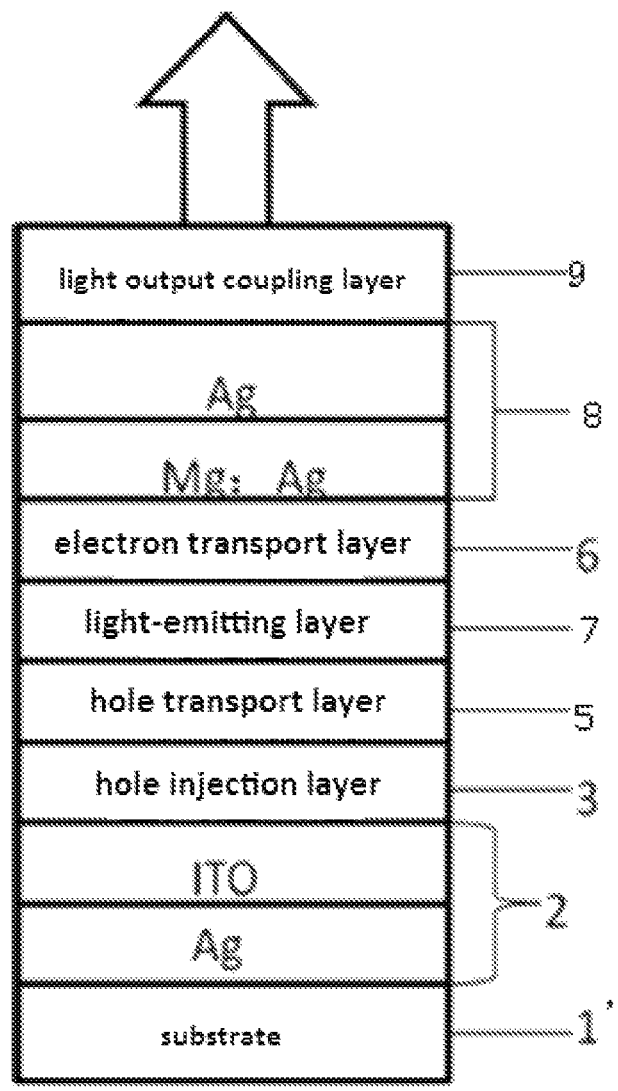

The reference numerals in the drawing are explained as follows: 1'—substrate, 1—reflective layer, 2—first electrode, 3—hole injection layer, 421—first optical compensation tier, 422—second optical compensation tier, 431—first optical compensation tier, 432—second optical compensation tier, 5—hole transport layer, 6—electron transport layer, 61—blue-light emitting layer, 62—green-light emitting layer, 63—red-light emitting layer, 7—light-emitting layer, 8—second electrode, 9—light output coupling layer.

DETAILED DESCRIPTION OF EMBODIMENTS

In order to more clearly illustrate the purpose, technical solution and advantages of the present application, hereinafter, specific embodiments of the present application will be further described in detail with reference to the appended drawings.

Embodiment 1

The present embodiment provides a top emitting OLED device for improving viewing angle characteristics which comprises, as shown in FIG. 1, a substrate 1', and a first electrode 2, a hole injection layer 3, a hole transport layer 5, a light-emitting layer 7, an electron transport layer 6, a second electrode 8, a light output coupling layer 9 sequentially stacked on the substrate 1'. When the light-emitting wavelength of the light-emitting layer 7 is in the visible light waveband, the hole injection layer 3 has a refractive index of no less than 1.8. The second electrode has a thickness of 10 nm-30 nm, preferably 10 nm-15 nm. The light output coupling layer 9 is made of material with a low light absorption index such as 2,9-dimethyl-4,7-diphenyl-1,10-phenanthroline or made of material with a high refractive index such as ZnSe and ZnS, with a thickness of 55 nm.

In the present embodiment, the first electrode 2 that is used as the anode comprises a first Ag layer with total-reflective function and a transparent ITO layer disposed on the first Ag layer, wherein the first Ag layer has a thickness of 150 nm, and the ITO layer has a thickness of 20 nm.

The second electrode 8 that is used as the cathode may be made of ITO, IZO or metal silver, or may be a composite structure comprising a first metal layer and a second metal layer, wherein the first metal layer is alkali metal or alloy thereof, alkali earth metal or alloy thereof, and the second metal layer is metal silver. In this embodiment, preferably, the second electrode comprises a first metal layer and a second metal layer, with the first metal layer being a Mg:Ag layer and the second metal layer being a metal silver layer, wherein the Mg:Ag layer has a thickness of 2 nm and a Mg-to-Ag ratio of 4:1, and the metal silver layer has a thickness of 14 nm.

There is a micro-cavity effect formed between the first electrode 2 and the second electrode 8.

The light-emitting layer 7 emits light after being excited, and the emitted light travels towards the first electrode 2 and the second electrode 8. Some of the emitted light is reflected by the first electrode 2, and then passes through the hole injection layer 3, the hole transport layer 5, the light-emitting layer 7, the electron transport layer 6 to arrive at the second electrode 8.

In the present embodiment, the light-emitting wavelength of the light-emitting layer 7 is in the blue-light waveband, i.e. the light-emitting wavelength is 460 nm, and the hole injection layer has a refractive index of N≥2.0. In this embodiment, particularly, the hole injection layer is selected to have a refractive index of 2.04. The hole injection layer has a thickness of 100 nm-105 nm. As this thickness may be selected according to actual requirements, in this embodiment, the hole injection layer 3 preferably has a thickness of 103 nm. In this embodiment, the thicknesses of other respective layers are as follows: the thickness of the hole transport layer is 20 nm, the thickness of the light-emitting layer is 20 nm, and the thickness of the electron transport layer is 35 nm.

Wherein, the hole injection layer 3 and the hole transport layer 5 are made of tertiary amine compound. In this embodiment, the hole injection layer is made of a material having a structural formula of

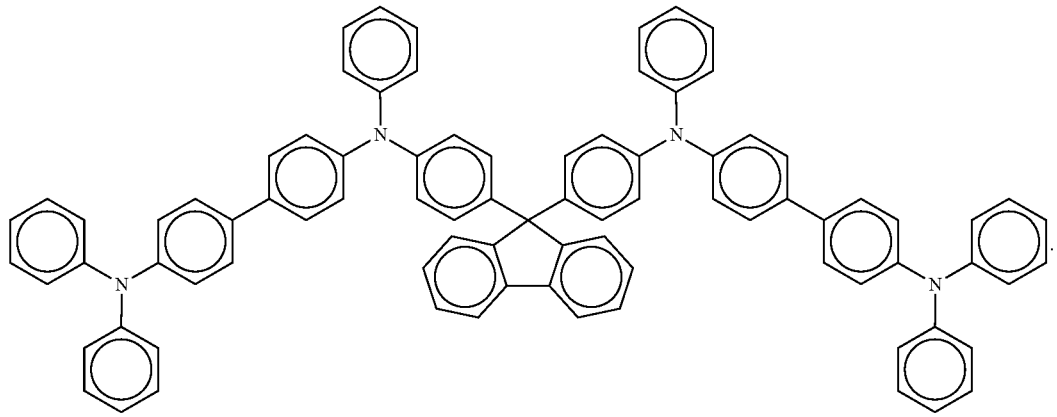

The hole transport layer may be made of a material identical to that of the hole injection layer, or may be made of tertiary amine compound with other structural formulas. In this embodiment, the hole transport layer is made of a material having a structural formula of

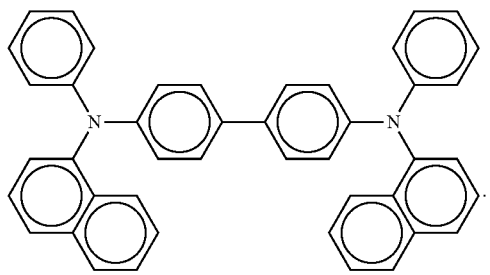

In this embodiment, the ultrathin second electrode 8 has a light transmittance larger than or equal to 25%, which inhibits multi-beam interference in the micro-cavity effect and increases the light output rate and transmittance rate. Meanwhile, by increasing the refractive index of the hole injection layer 3, the interference enhancement condition between the reflected light from the first electrode 2 and the emitted light from the light-emitting layer 7 is broken, and the wide-angle interference in the OLED device is inhibited, thereby weakening the micro-cavity effect and effectively improving the viewing angle characteristics of the OLED device. In addition, the light output coupling layer reduces light reflection of the semi-transparent metal electrode and increases output rate of the internal emitted light, thereby further improving optical performance of the display device.

Furthermore, when the light emitted by the light-emitting layer is in the visible light waveband, the material of the light-emitting layer can be selected according to the light-emitting waveband. In the present application, when the light-emitting waveband of the light-emitting layer is respectively in the blue-light waveband, in the green-light waveband and in the red-light waveband, the ways of choosing materials of the light-emitting layer are prior art and not the focus of the inventive concept of the present application, therefore are not described in detail in the respective embodiments of the present application.

Embodiment 2

On the basis of Embodiment 1, the top emitting OLED device of this embodiment has a structure as shown in FIG. 1. In this embodiment, the light-emitting wavelength of the light-emitting layer 7 is in the green-light waveband, i.e. the light-emitting wavelength is 510 nm, and the hole injection layer has a refractive index of N≥1.9. In this embodiment, particularly, the hole injection layer is selected to have a refractive index of 1.93. The hole injection layer has a thickness of 150 nm-155 nm. As this thickness may be selected according to actual requirements, in this embodiment, the hole injection layer 3 preferably has a thickness of 153 nm. Compared with Embodiment 1, the light-emitting layer 7 of this embodiment has a different light-emitting wavelength, and thus the light-emitting layer is made of a different material. This embodiment changes the thickness of the hole injection layer, while keeping the thicknesses of other respective layers identical to those of Embodiment 1.

In this embodiment, the hole injection layer is made of a material having a structural formula of

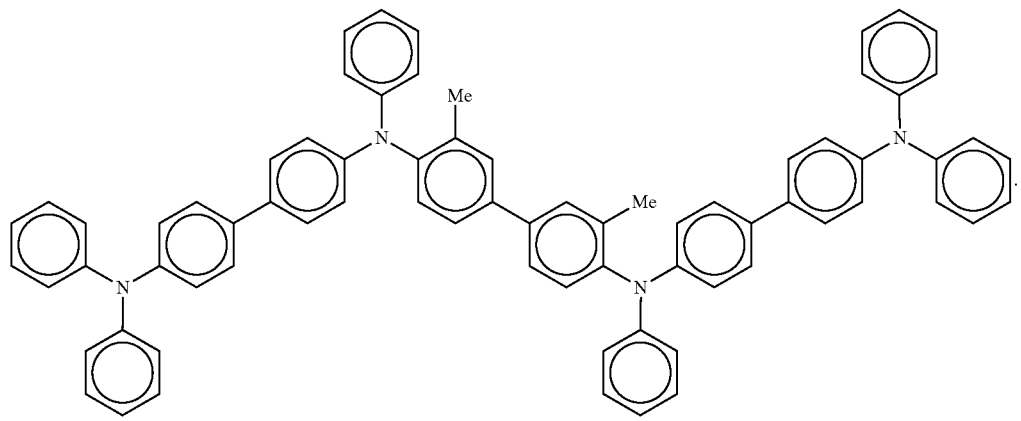

The hole transport layer is made of a material having a structural formula of

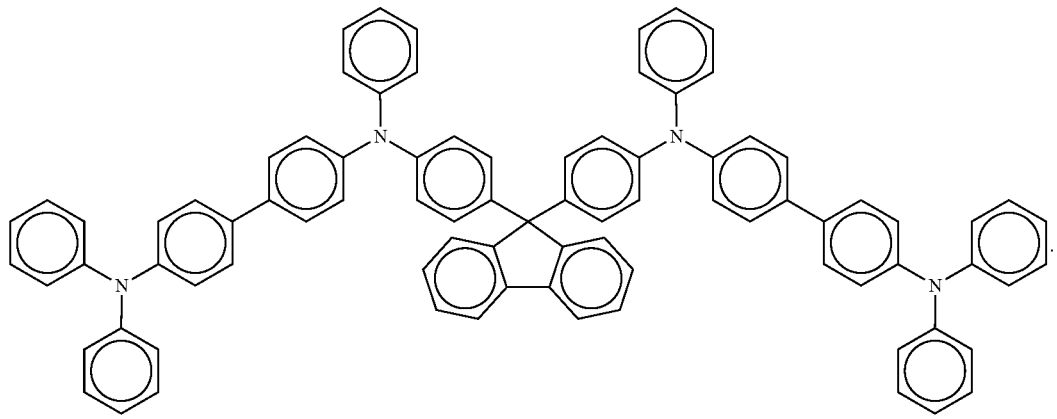

In this embodiment, the ultrathin second electrode 8 has a light transmittance larger than or equal to 25%, which inhibits multi-beam interference in the micro-cavity effect and increases the light output rate and transmittance rate. Meanwhile, similarly by increasing the refractive index of the hole injection layer 3, the interference enhancement condition between the reflected light from the first electrode 2 and the emitted light from the light-emitting layer 7 is broken, thereby effectively improving the viewing angle characteristics of the OLED device. In addition, the light output coupling layer reduces light reflection of the semi-transparent metal electrode and increases output rate of the internal emitted light, thereby further improving optical performance of the display device.

Embodiment 3

As being different from Embodiment 1 and Embodiment 2, the top emitting OLED device of this embodiment has a structure as shown in FIG. 1, wherein the light-emitting wavelength of the light-emitting layer is in the red-light waveband, i.e. the light-emitting wavelength is 620 nm, and the hole injection layer has a refractive index of N≥1.8. In this embodiment, particularly, the hole injection layer is selected to have a refractive index of 1.81. The hole injection layer has a thickness of 200 nm-205 nm. As this thickness may be selected according to actual requirements, in this embodiment, the hole injection layer 3 preferably has a thickness of 203 nm. Compared with Embodiment 1 or Embodiment 2, the light-emitting layer 7 of this embodiment has a different light-emitting wavelength, and thus the light-emitting layer is made of a different material.

In this embodiment, the hole injection layer is made of a material having a structural formula of

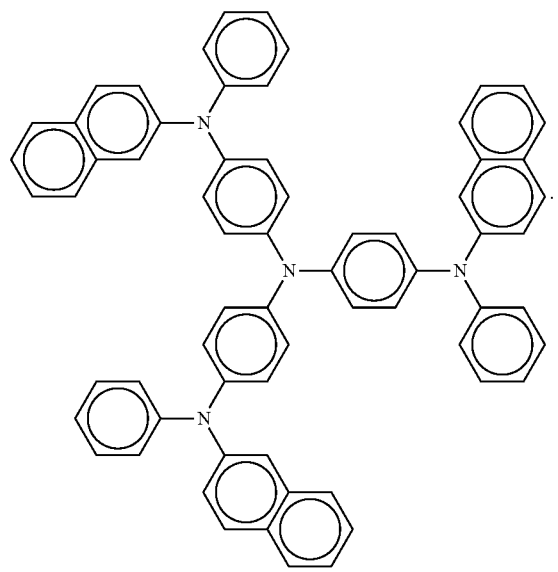

The hole transport layer is made of a material having a structural formula of

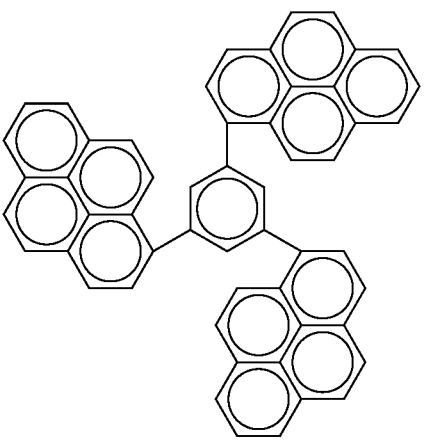

This embodiment only changes the thickness of the hole injection layer, while keeping the thicknesses of other respective layers identical to those of Embodiment 5.

In this embodiment, the ultrathin second electrode 8 has a light transmittance larger than or equal to 25%, which inhibits multi-beam interference in the micro-cavity effect and increases the light output rate and transmittance rate. Meanwhile, similarly by increasing the refractive index of the hole injection layer 3, the interference enhancement condition between the reflected light from the first electrode and the emitted light from the light-emitting layer is broken, thereby effectively improving the viewing angle characteristics of the OLED device. In addition, the light output coupling layer reduces light reflection of the semi-transparent metal electrode and increases output rate of the internal emitted light, thereby further improving optical performance of the display device.

Embodiment 4

In this embodiment, the light-emitting wavelength of the light-emitting layer 7 is in the blue-light waveband, i.e. the light-emitting wavelength is 460 nm, and the hole injection layer has a refractive index of N≥2.0 and a thickness of 100 nm. In this embodiment, the thicknesses of other respective layers are as follows: the thickness of the hole transport layer is 20 nm, the thickness of the light-emitting layer is 20 nm, and the thickness of the electron transport layer is 35 nm.

Wherein, the hole injection layer 3 and the hole transport layer 5 are made of tertiary amine compound having a structural formula of

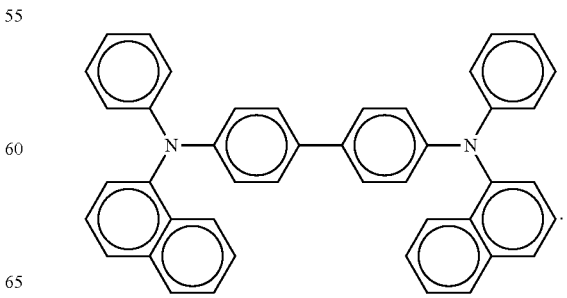

Embodiment 5

In this embodiment, the light-emitting wavelength of the light-emitting layer 7 is in the green-light waveband, and the hole injection layer has a refractive index of N≥1.90 and a thickness of 150 nm. The thickness of the hole transport layer is 20 nm, the thickness of the light-emitting layer is 20 nm, and the thickness of the electron transport layer is 35 nm.

Wherein, the hole injection layer 3 and the hole transport layer 5 are made of tertiary amine compound having a structural formula of

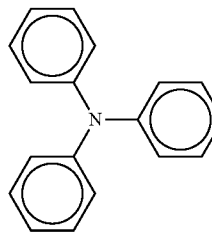

Embodiment 6

In this embodiment, the light-emitting wavelength of the light-emitting layer 7 is in the red-light waveband, and the hole injection layer has a refractive index of N≥1.8 and a thickness of 200 nm. The thickness of the hole transport layer is 20 nm, the thickness of the light-emitting layer is 20 nm, and the thickness of the electron transport layer is 35 nm.

Wherein, the hole injection layer 3 and the hole transport layer 5 are made of a compound having a structural formula of

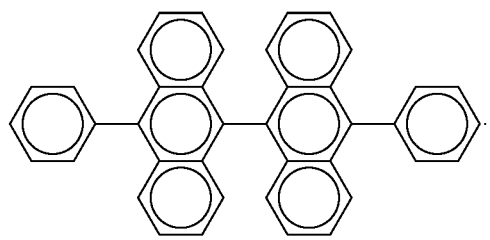

Embodiment 7

In this embodiment, the light-emitting wavelength of the light-emitting layer 7 is in the red-light waveband, and the hole injection layer has a refractive index of N≥1.8 and a thickness of 200 nm. The thickness of the hole transport layer is 20 nm, the thickness of the light-emitting layer is 20 nm, and the thickness of the electron transport layer is 35 nm.

Wherein, the hole injection layer 3 and the hole transport layer 5 are made of a compound having a structural formula of

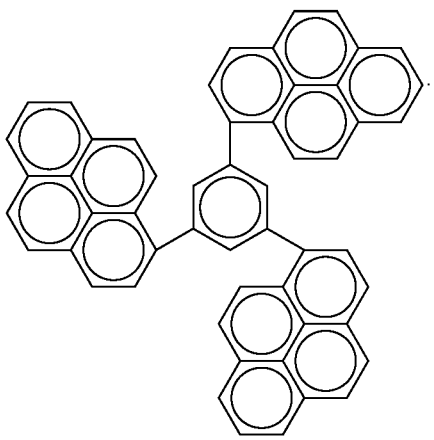

In order to further illustrate the advantages of the top emitting OLED device for improving viewing angle characteristics provided by the present application, comparative examples 1-3 are specifically designed and implemented to be compared with test results of Embodiments 1-3 of the present application.

Comparative Example 1

This comparative example provides a top emitting OLED device with a specific configuration similar to that of Embodiment 5, and the only difference is that the hole injection layer thereof is made of m-MTDATA, which is abbreviation of 4,4',4"-tri-(phenyl-(m-methylphenyl)-amino)-triphenylamine, with a molecular formula of

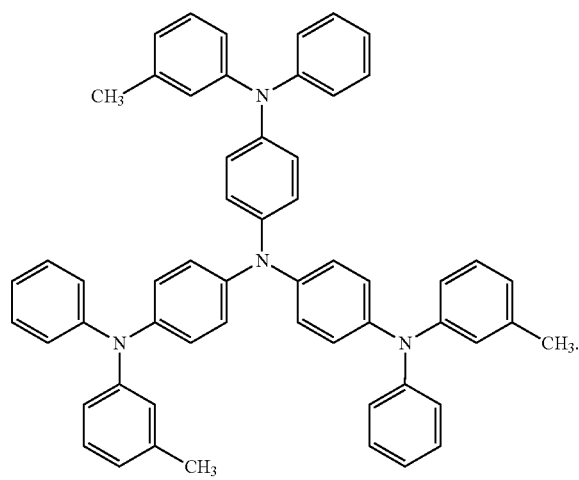 [SMILES: Cc1cccc(N(c2ccccc2)c2ccc(N(c3ccc(N(c4ccccc4)c4cccc(C)c4)cc3)c3ccc(N(c4ccccc4)c4cccc(C)c4)cc3)cc2)c1]

The above-mentioned material has a refractive index of 1.8 at the wavelength of 460 nm.

Comparative Example 2

This comparative example provides a top emitting OLED device with a specific configuration similar to that of Embodiment 6, and the only difference is that the hole injection layer thereof is made of m-MTDATA, which is abbreviation of 4,4',4''-tri-(phenyl-(m-methylphenyl)-amino)-triphenylamine, with a molecular formula of

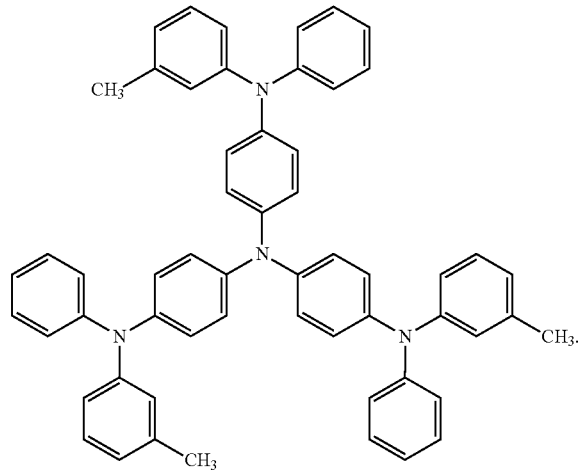 [SMILES: Cc1cccc(N(c2ccccc2)c2ccc(N(c3ccc(N(c4ccccc4)c4cccc(C)c4)cc3)c3ccc(N(c4ccccc4)c4cccc(C)c4)cc3)cc2)c1]

The above-mentioned material has a refractive index of 1.73 at the wavelength of 510 nm.

Comparative Example 3

This comparative example provides a top emitting OLED device with a specific configuration similar to that of Embodiment 7, and the only difference is that the hole injection layer thereof is made of m-MTDATA, which is abbreviation of 4,4',4''-tri-(phenyl-(m-methylphenyl)-amino)-triphenylamine, with a molecular formula of

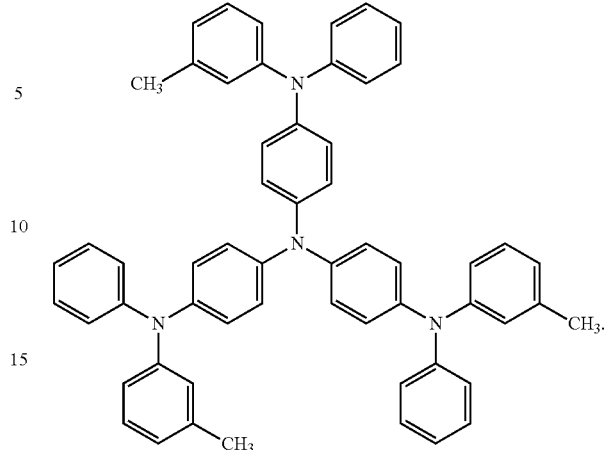

The above-mentioned material has a refractive index of 1.67 at the wavelength of 620 nm.

Under the condition of the same light-emitting wavelength of the light-emitting layer and the same viewing angle of 60 degree, the deviation amounts of light-emitting peaks of the configurations of Comparative Examples 1-3 and Embodiments 1-3 are respectively measured, and the results are listed in Table 1 to Table 3:

TABLE 1

| Wavelength (460 nm) | refractive index of the hole injection layer | deviation amount of light-emitting peak ($\Delta u'v'$) |
|---|---|---|
| Embodiment 1 | 2.04 | 0.021 |
| Comparative Example 1 | 1.8 | 0.035 |

TABLE 2

| Wavelength (510 nm) | refractive index of the hole injection layer | deviation amount of light-emitting peak ($\Delta u'v'$) |
|---|---|---|
| Embodiment 2 | 1.93 | 0.011 |
| Comparative Example 1 | 1.73 | 0.026 |

TABLE 3

| Wavelength (620 nm) | refractive index of the hole injection layer | deviation amount of light-emitting peak ($\Delta u'v'$) |
|---|---|---|
| Embodiment 3 | 1.81 | 0.045 |
| Comparative Example 1 | 1.67 | 0.068 |

As can be seen from data in Table 1 to Table 3, when the light-emitting wavelengths of the light-emitting layer are the same, at the same viewing angle, the deviation amounts of light-emitting peaks are effectively reduced.

Figure 2:
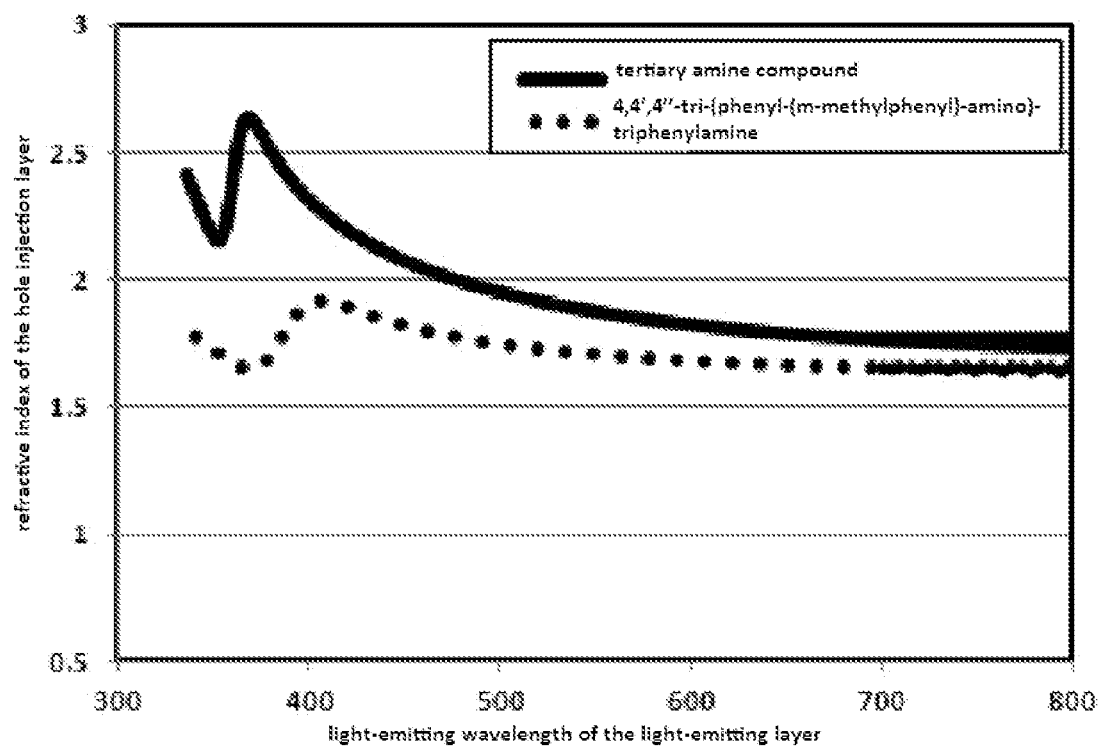

Furthermore, FIG. 2 shows a variation curve of the refractive index of the tertiary amine compound selected in the present application changing along with the change of wavelength, as well as a variation curve of the refractive index of 4,4',4''-tri-(phenyl-(m-methylphenyl)-amino)-triphenylamine changing along with the change of wavelength.

As can be seen in the figure, in the visible light waveband (300 nm-600 nm wavelength), the refractive index of the tertiary amine compound selected in the present application is always larger than the refractive index of 4,4',4"-tri-(phenyl-(m-methylphenyl)-amino)-triphenylamine. Therefore, by using the material selected in the present application to make the hole injection layer, the interference enhancement condition between the reflected light from the first electrode 2 and the emitted light from the light-emitting layer 7 is effectively broken, thereby effectively improving the viewing angle characteristics of the top emitting OLED device.

On the basis of the above embodiments, multi-layered optical compensation structures may be further provided in the red pixel area and in the green pixel area to meet the optical path requirements of their respective spectrum resonance periods, so as to effectively improve the photo-electric performances of the device and to be able to have a broad range of material choices. Such further embodiments are illustrated in the following Embodiments 8-11.

Embodiment 8

Figure 3:
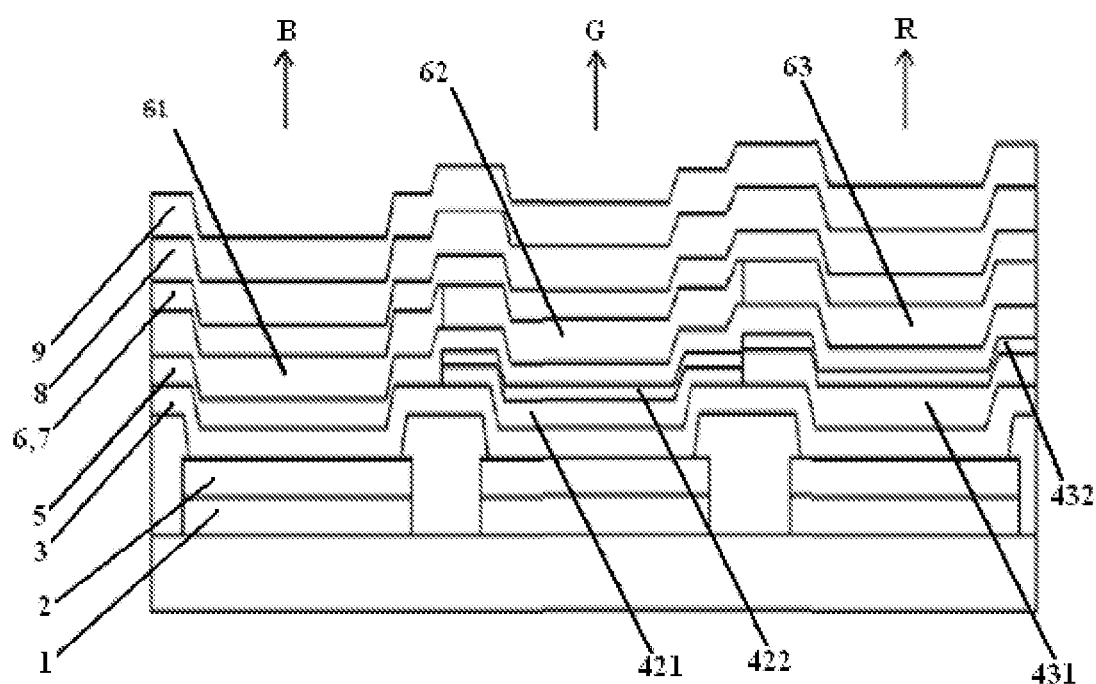

As shown in FIG. 3, there are a red pixel, a green pixel and a blue pixel in the OLED display device. The OLED display device of the present application, from bottom to top, sequentially comprises a substrate, a reflective layer 1, a first electrode 2 with reflective characteristic, a second electrode 8 with semi-transparent semi-reflective characteristic, and a light output coupling layer 9 disposed on the second electrode 8. There is an organic layer disposed between the first electrode 2 and the second electrode 8, and this organic layer comprises a hole injection layer 3, a hole transport layer (HTL) 5, a light-emitting layer 7 and an electron transport layer 6, wherein the hole injection layer 3 is adjacent to the first electrode 2 and disposed on the first electrode 2, wherein the reflective layer 1, the first electrode 2, the hole injection layer 3, the hole transport layer 5, the electron transport layer 6, the second electrode 8 and the light output coupling layer 9 have the same material and thickness, and wherein the light-emitting layer comprises a blue-light emitting layer 61, a green-light emitting layer 62 and a red-light emitting layer 63 made of different materials and respectively disposed in a blue pixel area, in a green pixel area and in a res pixel area. Since the size relationship among wave peak values of red, green and blue light-emitting spectrums is red≥green≥blue, according to the formula $$\frac{2\pi}{\lambda}\sum_m 2n_m d_m \cos\theta_0 - \phi_1(\lambda) - \phi_2(\lambda) = k2\pi, \quad (1)$$

the organic layer of the red-light unit is the thickest, followed by the thickness of the organic layer of the green-light unit, and the blue-light unit has the thinnest organic layer. Wherein, $\lambda$ is the peak value of the light-emitting spectrum, $\Phi_1$ is the phase angle of the reflective layer, $\Phi_2$ is the phase angle of the cathode, $d_m$ is the thickness of the respective layers in the organic layer and of the ITO (Indium Tin Oxides) layer (i.e., the respective layers between the reflective layer and the second electrode) (the total thickness $d=\Sigma d_m$), $n_m$ is the corresponding refractive index of the respective layers, $\theta_0$ is the corresponding angle of emergent light of the respective layers, and k is a constant. Therefore, the green pixel area also comprises an optical compensation layer which includes a first optical compensation tier 421 and a second optical compensation tier 422; the red pixel area also comprises an optical compensation layer which includes a first optical compensation tier 431 and a second optical compensation tier 432, and in the red pixel area as well as in the green pixel area, the thickness of the first optical compensation tier≥the thickness of the second optical compensation tier, so that the organic layer thicknesses of the red-light, green-light and blue-light units can meet the requirement of the above-mentioned formula simultaneously. The first optical compensation tier is made of a material containing triphenylamine groups with a HOMO (Highest Occupied Molecular Orbit) energy level ≥−5.4 eV; the second optical compensation tier is made of a material with a LUMO (Lowest Unoccupied Molecular Orbit) energy level ≤−5.2 eV and a thickness of 5 nm-15 nm; the hole transport layer (HTL) 5 is also made of a material containing triphenylamine groups with a HOMO energy level ≥−5.4 eV.

Figure 4:
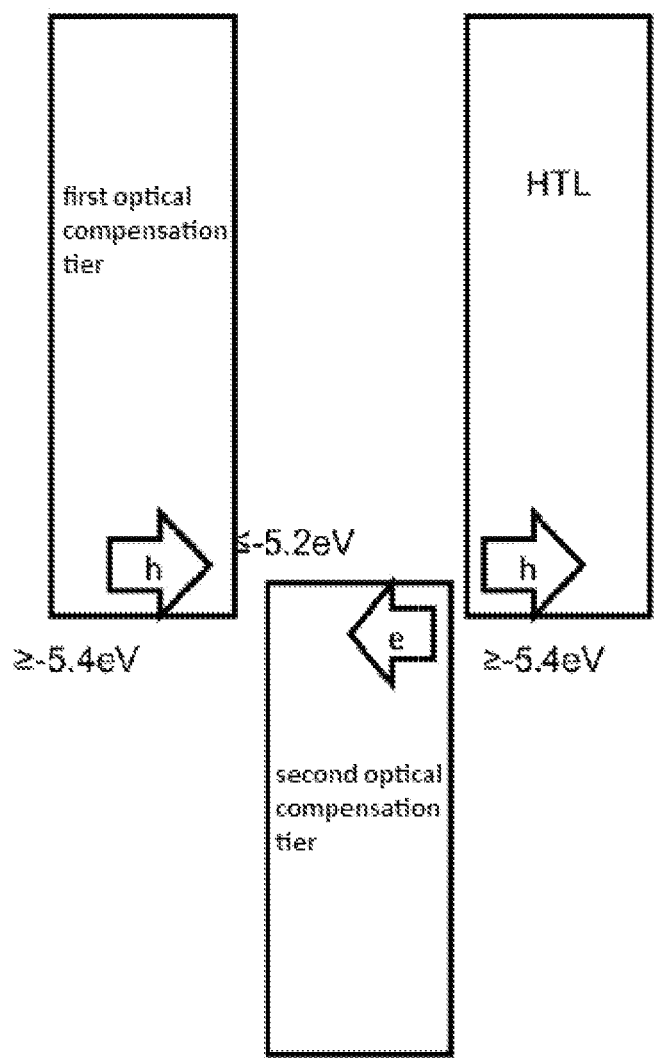
FIG. 4 is a schematic diagram of charge separation effect occurred at the interface between the first optical compensation tier and the second optical compensation tier.

As shown in FIG. 4, because the HOMO energy level of the first optical compensation tier and the HTL minus the LUMO energy level of the second optical compensation tier is ≥−0.2 eV, separation of electrons and holes can occur at the interface between the HTL and the second optical compensation tier, and effective charge exchange can occur at the interface between the first optical compensation tier and the second optical compensation tier, thereby reducing the voltage increment caused by too much thickness of the organic layer. Wherein, the first optical compensation tier is made of a material having a general formula of

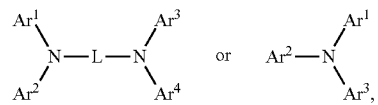

which includes

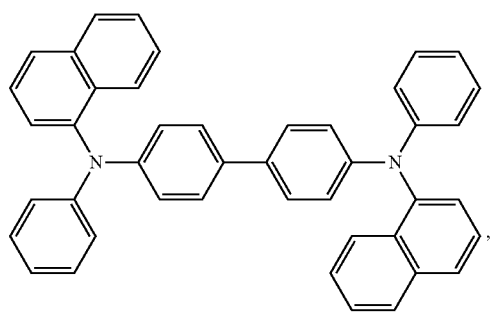

C1

-continued
C2
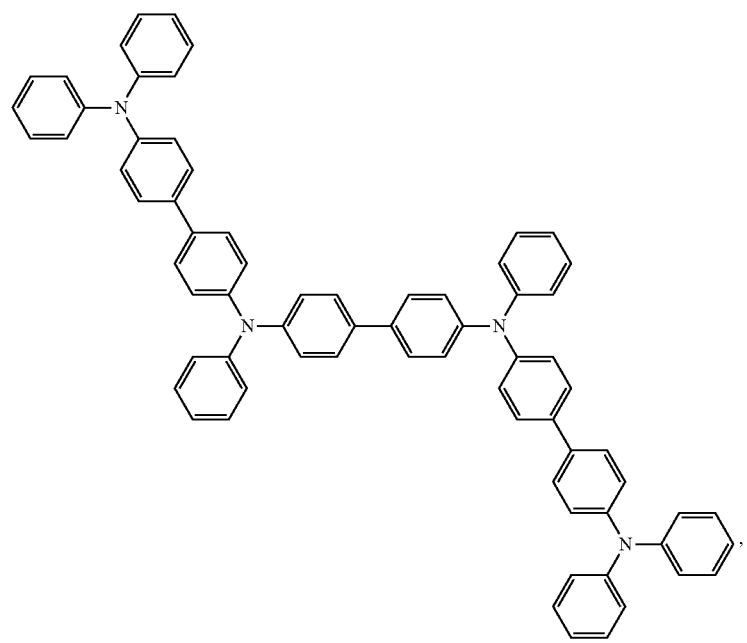
C3
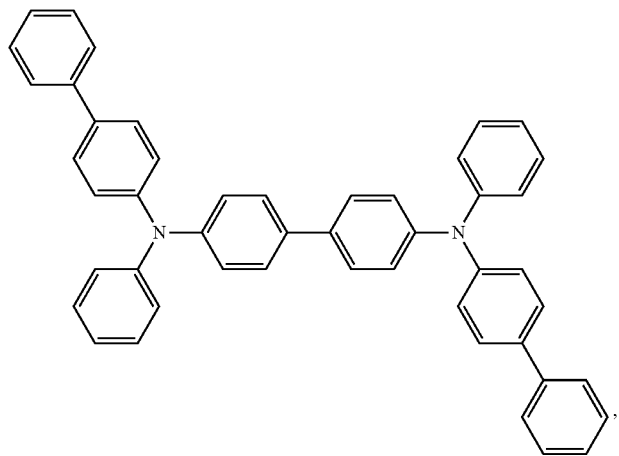
C4
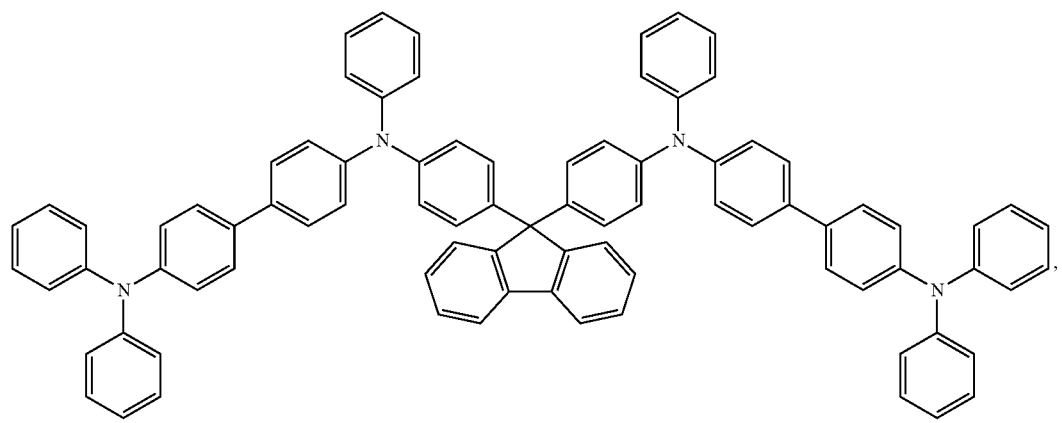

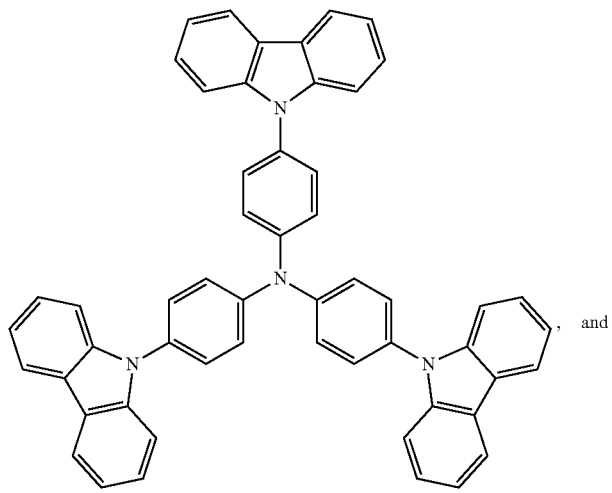
, and
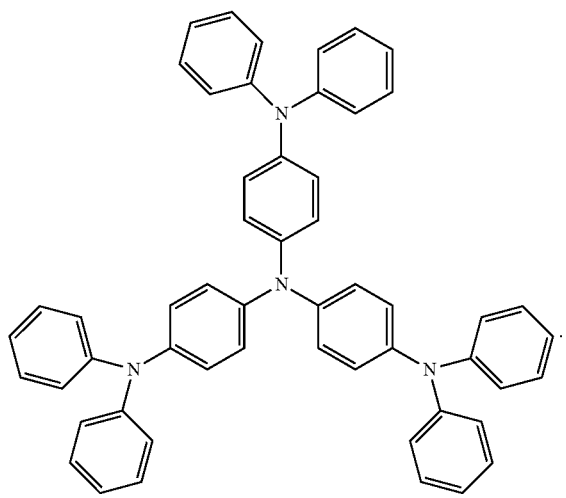
.
The second optical compensation tier is made of a material having a general formula of
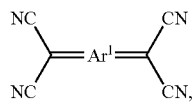
which includes
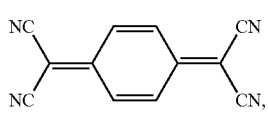
C7
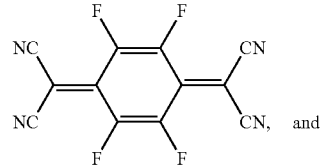
C8
and
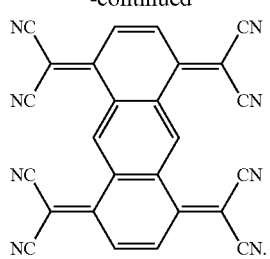
C9
The second optical compensation tier may also be made of HAT(CN):
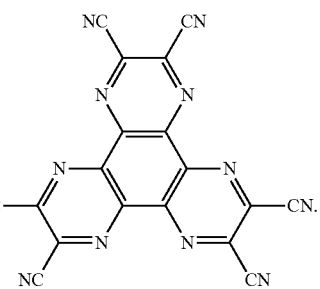

The first optical compensation tier may also be a doped structure formed by doping the above-mentioned material of first optical compensation tier with the above-mentioned material of second optical compensation tier at a ratio of 100:1 to 5:1.

Embodiment 9

Figure 5:
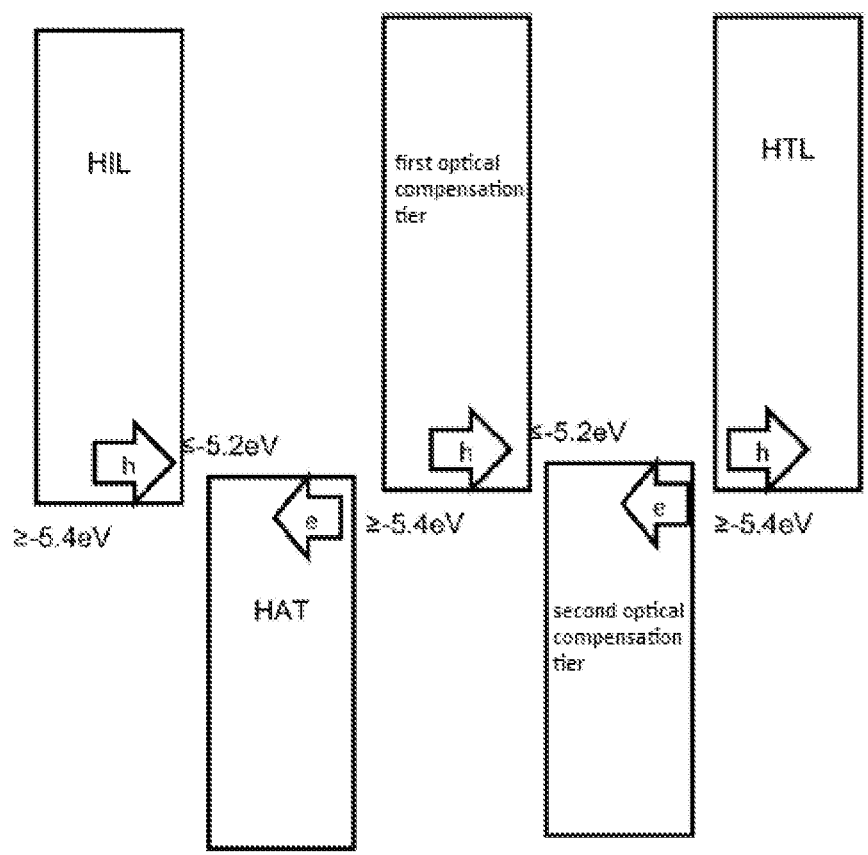
FIG. 5 is a schematic diagram of charge separation effect occurred at the interface between the second hole injection tier and the first optical compensation tier as well as at the interface between the two hole injection tiers.

On the basis of Embodiment 8, Embodiment 9 of the present application adopts a hole injection layer (HIL) 3 with a two-tier structure that comprises a first hole injection tier and a second hole injection tier, wherein the first hole injection tier is made of a material containing triphenylamine groups with a HOMO energy level ≥−5.4 eV, i.e. made of a material identical to that of the first optical compensation tier; the second hole injection tier is made of a material with a LUMO energy level ≤−5.2 eV and a thickness of 5 nm-15 nm, i.e. made of a material identical to that of the second optical compensation tier. Similar physical phenomenon as that in Embodiment 1 occurs at the interface between the second hole injection tier and the first optical compensation tier as well as at the interface between the two HILs, which further reduces the drive voltage of the device (as shown in FIG. 5).

Embodiment 10

On the basis of Embodiment 9, in Embodiment 10 of the present application, a third hole injection tier is added between the first hole injection tier and the first electrode, wherein the third hole injection tier is made of a material identical to that of the second hole injection tier, i.e. made of a material with a LUMO energy level ≤−5.2 eV and a thickness of 5 nm-15 nm, which further reduces the drive voltage.

Embodiment 11

On the basis of Embodiment 8, Embodiment 11 of the present application improves the optical compensation layer in the red pixel area by configuring the optical compensation layer in the red pixel area to be a four-tier structure that comprises a first optical compensation tier and a second optical compensation tier identical to those of the optical compensation layer in the green pixel area, as well as a third optical compensation tier (made of a material identical to that of the first optical compensation tier) and a fourth optical compensation tier (made of a material identical to that of the second optical compensation tier with an identical thickness).

The respective layer configurations of the aforementioned embodiments adopt parameters of material and thickness as listed in the following Table 4, and get data comparison results between the respective embodiments and the comparative example as listed in Table 5.

TABLE 4

| | | Hole injection layer | optical compensation layer | Hole transport layer | light-emitting layer | electron transport layer | cathode | light output coupling layer |
|---|---|---|---|---|---|---|---|---|
| Embodiment 1 | blue | C6(110 nm) | | NPB(20 nm) | AND(30 nm): 5% DPAVB | LG201(15 nm): 100% LiQ | Mg(12 nm): Ag(2 nm) | NPB(50 nm) |
| | green | C6(110 nm) | C6(50 nm):2% C8/ C8(5 nm) | NPB(20 nm) | CBP(30 nm): 10% Ir(ppy)$_3$ | LG201(15 nm): 100% LiQ | Mg(12 nm): Ag(2 nm) | NPB(50 nm) |
| | red | C6(110 nm) | C6(100 nm):2% C8/ C8(5 nm) | NPB(20 nm) | CBP(30 nm): 7% Ir(piq)$_3$ | LG201(15 nm): 100% LiQ | Mg(12 nm): Ag(2 nm) | NPB(50 nm) |
| Embodiment 2 | blue | C6(105 nm)/ C8(5 nm) | | NPB(20 nm) | AND(30 nm): 5% DPAVB | LG201(15 nm): 100% LiQ | Mg(12 nm): Ag(2 nm) | NPB(50 nm) |
| | green | C6(105 nm)/ C8(5 nm) | C6(50 nm):2% C8/ C8(5 nm) | NPB(20 nm) | CBP(30 nm): 10% Ir(ppy)$_3$ | LG201(15 nm): 100% LiQ | Mg(12 nm): Ag(2 nm) | NPB(50 nm) |
| | red | C6(105 nm)/ C8(5 nm) | C6(100 nm):2% C8/ C8(5 nm) | NPB(20 nm) | CBP(30 nm): 7% Ir(piq)$_3$ | LG201(15 nm): 100% LiQ | Mg(12 nm): Ag(2 nm) | NPB(50 nm) |
| Embodiment 3 | blue | C8(5 nm)/ C6(100 nm)/ C8(5 nm) | | NPB(20 nm) | AND(30 nm): 5% DPAVB | LG201(15 nm): 100% LiQ | Mg(12 nm): Ag(2 nm) | NPB(50 nm) |
| | green | C8(5 nm)/ C6(100 nm)/ C8(5 nm) | C6(50 nm):2% C8/ C8(5 nm) | NPB(20 nm) | CBP(30 nm): 10% Ir(ppy)$_3$ | LG201(15 nm): 100% LiQ | Mg(12 nm): Ag(2 nm) | NPB(50 nm) |
| | red | C8(5 nm)/ C6(100 nm)/ C8(5 nm) | C6(100 nm):2% C8/ C8(5 nm) | NPB(20 nm) | CBP(30 nm): 7% Ir(piq)$_3$ | LG201(15 nm): 100% LiQ | Mg(12 nm): Ag(2 nm) | NPB(50 nm) |
| Embodiment 4 | blue | C6(110 nm) | | NPB(20 nm) | AND(30 nm): 5% DPAVB | LG201(15 nm): 100% LiQ | Mg(12 nm): Ag(2 nm) | NPB(50 nm) |
| | green | C6(110 nm) | C6(50 nm):2% C8/ C8(5 nm) | NPB(20 nm) | CBP(30 nm): 10% Ir(ppy)$_3$ | LG201(15 nm): 100% LiQ | Mg(12 nm): Ag(2 nm) | NPB(50 nm) |
| | red | C6(110 nm) | C6(50 nm):2% C8/ C8(5 nm)/ C6(45 nm):2% C8/ C8(5 nm) | NPB(20 nm) | CBP(30 nm): 7% Ir(piq)$_3$ | LG201(15 nm): 100% LiQ | Mg(12 nm): Ag(2 nm) | NPB(50 nm) |
| comparative example | blue | C6(110 nm) | | NPB(20 nm) | AND(30 nm): 5% DPAVB | LG201(15 nm): 100% LiQ | Mg(12 nm): Ag(2 nm) | NPB(50 nm) |
| | green | C6(110 nm) | C6(55 nm) | NPB(20 nm) | CBP(30 nm): 10% Ir(ppy)$_3$ | LG201(15 nm): 100% LiQ | Mg(12 nm): Ag(2 nm) | NPB(50 nm) |
| | red | C6(110 nm) | C6(105 nm) | NPB(20 nm) | CBP(30 nm): 7% Ir(piq)$_3$ | LG201(15 nm): 100% LiQ | Mg(12 nm): Ag(2 nm) | NPB(50 nm) |

TABLE 5

|   |   | Embodiment 1 | Embodiment 2 | Embodiment 3 | Embodiment 4 | comparative example |
|---|---|---|---|---|---|---|
| blue | luminance cd/m$^2$ | 500 | 500 | 500 | 500 | 500 |
|  | voltage V | 4.92 | 4.81 | 4.66 | 4.91 | 4.92 |
|  | current density A/m$^2$ | 112 | 112 | 112 | 112 | 112 |
|  | efficiency cd/A | 4.45 | 4.46 | 4.45 | 4.45 | 4.45 |
|  | chrominance | (0.14, 0.06) | (0.14, 0.06) | (0.14, 0.06) | (0.14, 0.06) | (0.14, 0.06) |
| green | luminance cd/m$^2$ | 10000 | 10000 | 10000 | 10000 | 10000 |
|  | voltage V | 4.83 | 4.76 | 4.51 | 4.81 | 5.01 |
|  | current density A/m$^2$ | 136 | 139 | 131 | 135 | 144.9 |
|  | efficiency cd/A | 66.3 | 64.9 | 68.9 | 66.5 | 62.1 |
|  | chrominance | (0.20, 0.72) | (0.20, 0.72) | (0.20, 0.72) | (0.20, 0.72) | (0.20, 0.72) |
| red | luminance cd/m$^2$ | 5000 | 5000 | 5000 | 5000 | 5000 |
|  | voltage V | 4.98 | 4.85 | 4.68 | 4.62 | 5.09 |
|  | current density A/m$^2$ | 237 | 243 | 247 | 219 | 260 |
|  | efficiency cd/A | 21.1 | 20.6 | 20.2 | 22.8 | 19.2 |
|  | chrominance | (0.67, 0.33) | (0.67, 0.33) | (0.67, 0.33) | (0.67, 0.33) | (0.67, 0.33) |

The respective layer configurations of the aforementioned embodiments adopt parameters of material and thickness as listed in the following Table 6, and get data comparison results between the respective embodiments and the comparative example as listed in Table 7.

TABLE 6

|   |   | Hole injection layer | optical compensation layer | Hole transport layer | light-emitting layer | electron transport layer | cathode | light output coupling layer |
|---|---|---|---|---|---|---|---|---|
| Embodiment 1 | blue | C2(110 nm) |  | NPB(20 nm) | AND(30 nm): 5% DPAVB | LG201(15 nm): 100% LiQ | Mg(12 nm): Ag(2 nm) | NPB(50 nm) |
|  | green | C2(110 nm) | C2(45 nm)/ HAT(CN)(10 nm) | NPB(20 nm) | CBP(30 nm): 10% Ir(ppy)$_3$ | LG201(15 nm): 100% LiQ | Mg(12 nm): Ag(2 nm) | NPB(50 nm) |
|  | red | C2(110 nm) | C2(95 nm)/ HAT(CN)(10 nm) | NPB(20 nm) | CBP(30 nm): 7% Ir(piq)$_3$ | LG201(15 nm): 100% LiQ | Mg(12 nm): Ag(2 nm) | NPB(50 nm) |
| Embodiment 2 | blue | C2(105 nm)/ HAT(CN)(10 nm) |  | NPB(20 nm) | AND(30 nm): 5% DPAVB | LG201(15 nm): 100% LiQ | Mg(12 nm): Ag(2 nm) | NPB(50 nm) |
|  | green | C2(105 nm)/ HAT(CN)(10 nm) | C2(45 nm)/ HAT(CN)(10 nm) | NPB(20 nm) | CBP(30 nm): 10% Ir(ppy)$_3$ | LG201(15 nm): 100% LiQ | Mg(12 nm): Ag(2 nm) | NPB(50 nm) |
|  | red | C2(105 nm)/ HAT(CN)(10 nm) | C2(95 nm)/ HAT(CN)(10 nm) | NPB(20 nm) | CBP(30 nm): 7% Ir(piq)$_3$ | LG201(15 nm): 100% LiQ | Mg(12 nm): Ag(2 nm) | NPB(50 nm) |
| Embodiment 3 | blue | HAT(CN)(10 nm)/ C2(105 nm)/ HAT(CN)(10 nm) |  | NPB(20 nm) | AND(30 nm): 5% DPAVB | LG201(15 nm): 100% LiQ | Mg(12 nm): Ag(2 nm) | NPB(50 nm) |
|  | green | HAT(CN)(10 nm)/ C2(105 nm)/ HAT(CN)(10 nm) | C2(45 nm)/ HAT(CN)(10 nm) | NPB(20 nm) | CBP(30 nm): 10% Ir(ppy)$_3$ | LG201(15 nm): 100% LiQ | Mg(12 nm): Ag(2 nm) | NPB(50 nm) |
|  | red | HAT(CN)(10 nm)/ C2(105 nm)/ HAT(CN)(10 nm) | C2(95 nm)/ HAT(CN)(10 nm) | NPB(20 nm) | CBP(30 nm): 7% Ir(piq)$_3$ | LG201(15 nm): 100% LiQ | Mg(12 nm): Ag(2 nm) | NPB(50 nm) |
| Embodiment 4 | blue | C2(110 nm) |  | NPB(20 nm) | AND(30 nm): 5% DPAVB | LG201(15 nm): 100% LiQ | Mg(12 nm): Ag(2 nm) | NPB(50 nm) |
|  | green | C2(110 nm) | C2(45 nm)/ HAT(CN)(10 nm) | NPB(20 nm) | CBP(30 nm): 10% Ir(ppy)$_3$ | LG201(15 nm): 100% LiQ | Mg(12 nm): Ag(2 nm) | NPB(50 nm) |
|  | red | C2(110 nm) | C2(45 nm)/ HAT(CN)(10 nm)/ C2(40 nm)/ HAT(CN)(10 nm) | NPB(20 nm) | CBP(30 nm): 7% Ir(piq)$_3$ | LG201(15 nm): 100% LiQ | Mg(12 nm): Ag(2 nm) | NPB(50 nm) |

TABLE 6-continued

|  |  | Hole injection layer | optical compensation layer | Hole transport layer | light-emitting layer | electron transport layer | cathode | light output coupling layer |
|---|---|---|---|---|---|---|---|---|
| comparative example | blue | C2(110 nm) |  | NPB(20 nm) | AND(30 nm): 5% DPAVB | LG201(15 nm): 100% LiQ | Mg(12 nm): Ag(2 nm) | NPB(50 nm) |
|  | green | C2(110 nm) | C2(55 nm) | NPB(20 nm) | CBP(30 nm): 10% Ir(ppy)$_3$ | LG201(15 nm): 100% LiQ | Mg(12 nm): Ag(2 nm) | NPB(50 nm) |
|  | red | C2(110 nm) | C2(105 nm) | NPB(20 nm) | CBP(30 nm): 7% Ir(piq)$_3$ | LG201(15 nm): 100% LiQ | Mg(12 nm): Ag(2 nm) | NPB(50 nm) |

TABLE 7

|  |  | Embodiment 1 | Embodiment 2 | Embodiment 3 | Embodiment 4 | comparative example |
|---|---|---|---|---|---|---|
| blue | luminance cd/m$^2$ | 500 | 500 | 500 | 500 | 500 |
|  | voltage V | 4.85 | 4.72 | 4.59 | 4.85 | 4.85 |
|  | current density A/m$^2$ | 500 | 500 | 500 | 500 | 500 |
|  | efficiency cd/A | 4.33 | 4.41 | 4.35 | 4.33 | 4.32 |
|  | chrominance | (0.14, 0.06) | (0.14, 0.06) | (0.14, 0.06) | (0.14, 0.06) | (0.14, 0.06) |
| green | luminance cd/m$^2$ | 10000 | 10000 | 10000 | 10000 | 10000 |
|  | voltage V | 4.77 | 4.65 | 4.43 | 4.76 | 4.82 |
|  | current density A/m$^2$ | 154 | 156 | 150 | 151 | 161 |
|  | efficiency cd/A | 65.1 | 64.2 | 66.8 | 66.2 | 61.9 |
|  | chrominance | (0.20, 0.72) | (0.20, 0.72) | (0.20, 0.72) | (0.20, 0.72) | (0.20, 0.72) |
| red | luminance cd/m$^2$ | 5000 | 5000 | 5000 | 5000 | 5000 |
|  | voltage V | 4.91 | 4.75 | 4.61 | 4.55 | 4.97 |
|  | current density A/m$^2$ | 249 | 249 | 244 | 233 | 256 |
|  | efficiency cd/A | 20.2 | 20.1 | 20.5 | 21.5 | 19.5 |
|  | chrominance | (0.67, 0.33) | (0.67, 0.33) | (0.67, 0.33) | (0.67, 0.33) | (0.67, 0.33) |

The aforementioned contents are merely preferable embodiments of the present application, and are not intended to be used to restrict the protection scope of the present application.

Apparently, the aforementioned embodiments are merely examples illustrated for clearly describing the present application, rather than limiting the implementation ways thereof. For those skilled in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present application.

The invention claimed is:

1. A top emitting OLED device for improving viewing angle characteristics, comprising:
   a substrate; and
   a first electrode, a hole injection layer, a hole transport layer, a light-emitting layer, an electron transport layer, a second electrode and a light output coupling layer sequentially stacked on the substrate,
   wherein the second electrode has a light transmittance no less than 25%, and the hole injection layer has a refractive index no less than 1.8 at the wavelength of maximum light-emission,
   wherein the hole injection layer and the hole transport layer respectively comprises a compound having a structure formula of

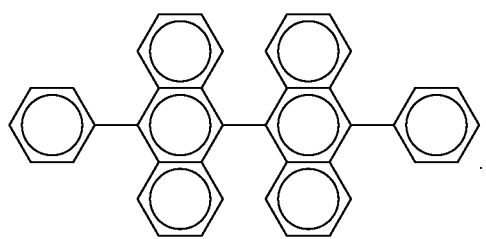

(6)

2. The top emitting OLED device in accordance with claim 1, wherein, the hole injection layer in a blue pixel area has a refractive index of N≥2.0; the hole injection layer in a green pixel area has a refractive index of N≥1.9; the hole injection layer in a red pixel area has a refractive index of N≥1.8.

3. The top emitting OLED device in accordance with claim 1, wherein the second electrode is made of indium tin oxide, indium zinc oxide or metal silver.

4. The top emitting OLED device in accordance with claim 1, wherein, the second electrode comprises a first metal layer and a second metal layer, wherein the first metal layer is alkali metal or alloy thereof, alkaline earth metal or alloy thereof, and the second metal layer is metal silver.

5. The top emitting OLED device in accordance with claim 4, wherein, the second electrode has a thickness of 10 nm-30 nm.

6. The top emitting OLED device in accordance with claim 1, characterized in that, the light output coupling layer is made of 2,9-dimethyl-4,7-diphenyl-1,10-phenanthroline.

7. The top emitting OLED device in accordance with claim 1, wherein the second electrode has a thickness of 10 nm-15 nm; or the light output coupling layer is made of ZnSe or ZnS.

8. The top emitting OLED device in accordance with claim 1, wherein the first electrode comprises a first Ag layer with total-reflective function and a transparent ITO layer disposed on the first Ag layer, wherein the first Ag layer has a thickness of 150 nm, and the ITO layer has a thickness of 20 nm.

9. The top emitting OLED device in accordance with claim 4, wherein the first metal layer being a Mg:Ag layer and the second metal layer being a metal silver layer, wherein the Mg:Ag layer has a thickness of 2 nm and a Mg-to-Ag ratio of 4:1, and the metal silver layer has a thickness of 14 nm.

* * * * *